United States Patent [19]

Evans

[11] Patent Number: 4,862,171

[45] Date of Patent: Aug. 29, 1989

[54] ARCHITECTURE FOR HIGH SPEED ANALOG TO DIGITAL CONVERTERS

[75] Inventor: William P. Evans, Glen Burnie, Md.

[73] Assignee: Westinghouse Electric Corp., Pittsburgh, Pa.

[21] Appl. No.: 111,764

[22] Filed: Oct. 23, 1987

[51] Int. Cl.⁴ ............................................. H03M 1/14
[52] U.S. Cl. ..................................... 341/156; 341/118
[58] Field of Search ............... 323/230; 340/347 AD, 340/347 M; 341/118, 136, 156

[56] References Cited

U.S. PATENT DOCUMENTS

| | | |
|---|---|---|
| 3,226,661 | 12/1965 | Garver et al. ........................ 323/230 |
| 3,688,221 | 8/1972 | Fruhalf . |
| 3,860,952 | 1/1975 | Tallent et al. . |
| 3,891,884 | 6/1975 | Kerwin et al. . |
| 4,070,665 | 1/1978 | Glennon et al. . |
| 4,083,043 | 4/1978 | Breuer . |
| 4,214,232 | 7/1980 | Shaw et al. . |
| 4,227,183 | 10/1980 | Ninomiya . |
| 4,340,882 | 7/1982 | Maio et al. . |
| 4,393,368 | 7/1983 | Rasmussen . |
| 4,393,371 | 7/1983 | Morgan-Smith . |
| 4,410,876 | 10/1983 | Sawagata . |
| 4,423,408 | 12/1983 | Place . |
| 4,535,319 | 8/1985 | Penney . |
| 4,544,917 | 10/1985 | Lenhoff, Jr. . |
| 4,559,523 | 12/1985 | Wakita . |
| 4,599,602 | 7/1986 | Matzuzawa et al. . |
| 4,608,555 | 8/1986 | Hoeft . |
| 4,612,533 | 9/1986 | Evans . |
| 4,618,850 | 10/1986 | Lenhoff, Jr. . |
| 4,686,511 | 8/1987 | Koen ........................... 340/342 AD |

Primary Examiner—William M. Shoop, Jr.
Assistant Examiner—Marc S. Hoff
Attorney, Agent, or Firm—W. G. Sutcliff

[57] ABSTRACT

A very high speed, high resolution analog to digital converter is detailed including a subrange architecture, with the main range A/D including a digital to analog portion for producing an analog signal which can be summed with an amplified input analog signal. The summed analog signal is directed through a unity gain buffer to the subrange analog to digital converter, with the buffer isolating the high input capacitance of the subrange A/D from the summing node. The main range A/D provides a binary coded digital signal which approximates the input analog signal and which defines the most significant bits (MSB) of the digital output. The least significant bits (LSB) are had from the subrange A/D which provides at least one more bit than the number of MSB to provide overlap for forming the combined digital output signal.

12 Claims, 1 Drawing Sheet

ARCHITECTURE FOR HIGH SPEED ANALOG TO DIGITAL CONVERTERS

BACKGROUND OF THE INVENTION

1. Field of the Invention

This invention relates to analog to digital converters and more particularly to converters which will operate at high speeds and over wide ranges of temperatures and other conditions to produce highly accurate and reliable results, without requiring self-calibration procedures. Converters of the invention have a relatively simple architecture and economically manufacturable.

2. Description of the Prior Art

High speed A/D converters have heretofore been provided which have included "flash" converter integrated circuits. Such circuits have included a plurality of voltage comparators which compare the level of an analog input voltage with a series of reference voltage levels which are supplied in steps of uniform magnitude, typically by a string of resistors which are connected to a reference voltage source. The magnitude of the input analog signal is indicated by the number of comparator output signals produced, i.e., by the number of reference voltage levels which are exceeded by the input voltage. A "thermometer" code output is thus produced which is converted to binary by a decode circuit.

A problem with such flash converter circuits is that the number of required comparators and voltage levels doubles with each additional bit of the required resolution, so that an excessively large number of comparators and associated voltage levels would be required to obtain high resolution. In view of this problem, subranging A/D architectures have been used. A main range A/D converter is used which is of the flash type and which has a limited number of comparators, e.g., 32 or 64. The main A/D converter produces, in effect, a first approximation of the magnitude of an input analog signal. The first approximation so produced is then converted to an analog signal with a high speed precision D/A. The analog signal developed at the output of the D/A is then subtracted from the analog input signal, the result of the subtraction being applied to a second or "subrange" A/D converter to produce a binary coded output which is logically combined with a binary coded output from the main range A/D converter to produce the final binary coded digital output.

In an attempt to obtain high speed operation with prior subranging architectures, the analog input signal has been delayed before subtraction of the output signal of the high speed precision D/A therefrom, for the purpose of matching the delays of the main range A/D. A sample and a hold circuit is typically used as an input stage to apply a signal to the main range A/D and to obtain the required delay, a second sample and hold circuit may be used or, in the alternative, a delay line may be used. There is also a problem with digital skew going into the D/A and a register is oftentimes placed at the output of the main A/D to extend the time that the digital data is valid.

Prior subranging architectures have had problems with respect to accuracy and reliability, especially with respect to the use of a delay line which adds an error source since termination of a delay line is never exact and multiple reflections may be produced to degrade the conversion accuracy when sampling high frequency signals. In addition, the input and output terminations on the delay line may attenuate the signal by a factor of two so that the gain of the sub-range amplifier must be increased by a factor of two. Offsets by buffers in the analog delay line path coupled with the extra sub-range gain required makes the architecture sensitive to temperature variations. In addition, operation at frequencies other than the frequency for which the converter circuitry was designed can cause large conversion errors.

A specially constructed A/D/A (Analog/Digital-/Analog) integrated circuit component has been tried in conventional architectures in an attempt to avoid problems, but with only limited success. The A/D/A Component includes comparators which drive decoding logic to develop a binary coded digital output and which also directly drive current sources to develop an analog output, thereby forming an A/D/A component in which the speed of development of the analog output is increased. It is found that although this component has important advantages, the use of this component with the conventional subrange architecture is still limited in providing a high speed and high resolution converter.

SUMMARY OF THE INVENTION

This invention was evolved with the general object of overcoming disadvantages of prior high speed A/D converters and of providing a converter which is operable at very high speeds and with high resolution while providing high accuracy and reliability while using a minimum number of circuit elements and being otherwise readily and economically manufacturable.

In a system constructed in accordance with the invention, a subrange architecture is used which includes main range and subrange A/D converters as aforementioned, producing digital signals which are combined by logic circuitry to develop a final output. A signal is applied to the subrange A/D converter from a summing node at which a signal is developed corresponding to the difference between first and second analog signals. The first signal is proportional to the input signal and, in accordance with an important aspect of the invention, it is developed by an input signal amplifier having an input to which the input analog signal is applied. The second signal is developed from the main range A/D which is preferably an A/D/A component as aforementioned, with comparators operative to compare the magnitude of an input voltage signal with reference voltage levels in steps of uniform magnitude, preferably developed by a string of resistors connected to a reference voltage source. The A/D/A component also includes transistors and current sources, the transistors being connected in series with the current sources and being directly controlled by the comparators. In a preferred arrangement, the summing node is connected through a resistor to the amplifier output and it is also connected through the transistors of the A/D/A to the current sources therewithin.

An error or difference signal amplifier is also provided, having an input connected to the summing node and having an output connected to a subrange A/D converter, serving to isolate the summing node from the high capacitance input of the subrange A/D converter and acheiving an increased speed of response at the summing node.

The input signal amplifier is particularly advantageous. It provides a source of a voltage which is maintained proportional to the input analog voltage regardless of the number of A/D/A current sources which are connected through the transistors to the summing node, to obtain a high degree of accuracy with respect to developing the desired error or difference voltage at the summing node. It is also found that the response characteristic of the input signal amplifier with respect to changes in the input analog signal can be correlated to that provided by the comparators and transistors within the A/D/A so that the signals are correlated for comparison at the summing node. No delay line is required and the problems associated with a delay line are avoided.

In accordance with a specific feature of the invention, the input signal amplifier has a gain which is substantially greater than unity, to increase the response speed and obtain increased accuracy. The voltage developed at the summing node is proportional to the input signal amplifier gain and the accuracy of conversion in the subrange A/D converter can be increased. The gain required by the difference signal amplifier is reduced and, in a preferred arrangement, it operates as a unity gain buffer.

A further feature relates to the use of a subrange A/D having an extra bit capacity, greater than the number of output bits less the bit capacity of the main range A/D, such as to provide a small quanta size at the input of the subrange A/D. This permits the summing resistor to be of smaller size and also provides an overlap of the main range and subrange bits. The overlap is highly advantageous in that it allows a less accurate conversion by the main range A/D which may be strobed before an input sample and hold circuit has completely settled.

These and other objects, features and advantages will become more fully apparent from the following detailed description taken in conjunction with the accompanying drawings.

DESCRIPTION OF A PREFERRED EMBODIMENT

Figure 1:
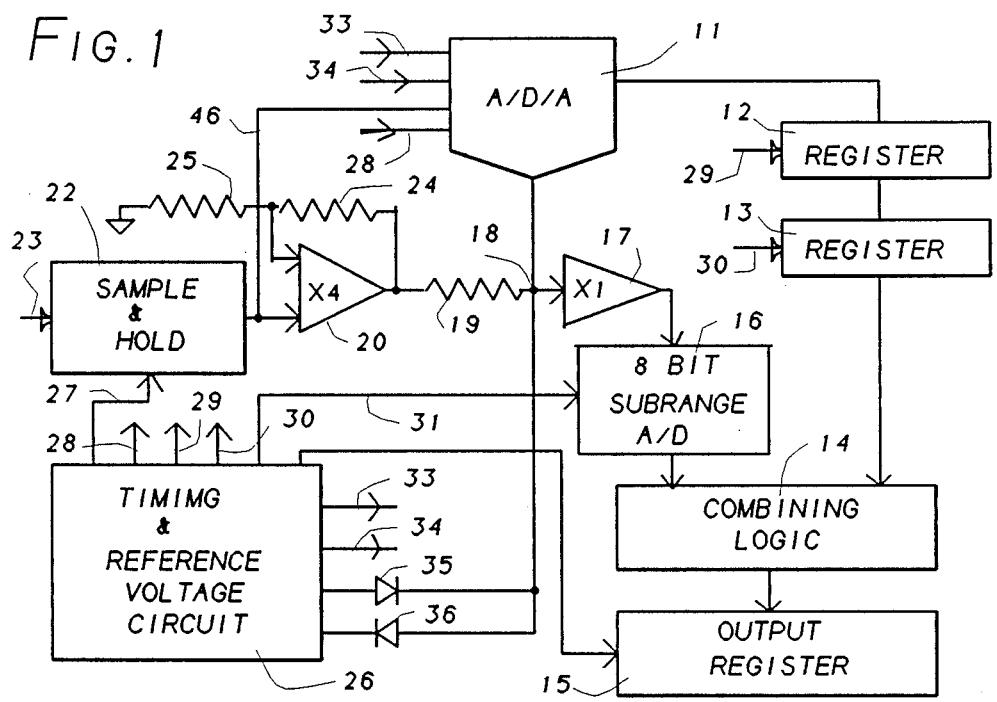
FIG. 1 is a schematic diagram of a analog to digital converter system constructed in accordance with the invention.

Reference numeral 10 generally designates an analog to digital converter system constructed in accordance with the principles of this invention. For the purpose of illustrative example, a system is shown which is designed for operation at frequencies of up to 20 MHz with 10 bit resolution and which has components with certain values and bit capacities or other characteristics, but it will be understood that the invention is not limited to any particular speed or resolution or to the particular component values and characteristics as shown and described.

The system 10 has a subrange architecture. It includes a A/D/A component 11, part of which forms a main range A/D converter operative to develop binary coded digital signals corresponding to a first approximation of the input and defining the more significant bits of the final output, e.g. the five more significant bits, such signals being clocked serially through registers 12 and 13 to a combining logic circuit 14 coupled to an output register 15. Binary coded digital signals which correspond to the less significant bits of the final output are supplied to the combining logic circuit 14 from a subrange A/D converter 16. For a 10 bit output and with the 5 more significant bits being supplied from the A/D/A component 11, the subrange A/D converter 16 must supply at least the 5 less significant bits but, as indicated, it has a bit capacity of eight to provide an overlap and to obtain advantages as hereinafter discussed.

The input of the subrange A/D converter 16 is coupled to the output of an amplifier stage 17 the input of which is connected to a circuit point 18 which forms a summing node, the signal thereat being the difference between first and second analog signals. The first analog signal has a magnitude proportional to that of the input signal and is received through a resistor 19 from the output of an operational amplifier 20. The second analog signal is received from the analog output of the A/D/A component 11 and has a magnitude proportional to the digital output of the A/D/A component 11. Thus the analog signal developed at the summing node 18 corresponds to any difference or error between the actual magnitude of the input analog signal and the more significant 5 bits of the signal developed by the A/D/A component 11.

A sample and hold circuit 22 is provided having an input connected to a line 23 to which an analog input signal is applied and having an output connected to an input of the A/D/A component 11 and also to a plus input of the operational amplifier 20. The minus input of amplifier 20 is connected through a resistor 24 to its output and also through a resistor 25 to ground. A timing and reference voltage source 26 supplies clock signals through lines 27, 28, 29, 30, 31 and 32 to the sample and hold circuit 22, the A/D/A component 11, the register 12, the register 13, the subrange A/D converter 16 and the output register 15. Source 26 also supplies voltages to the various circuits of the system, including reference voltages supplied through lines 33 and 34 to the A/D/A component 11 and clamp or limit voltages supplied through diodes 35 and 36 to the summing node 18 to limit the voltage excursions thereat and the voltage excursions at the input of converter 16.

Figure 2:
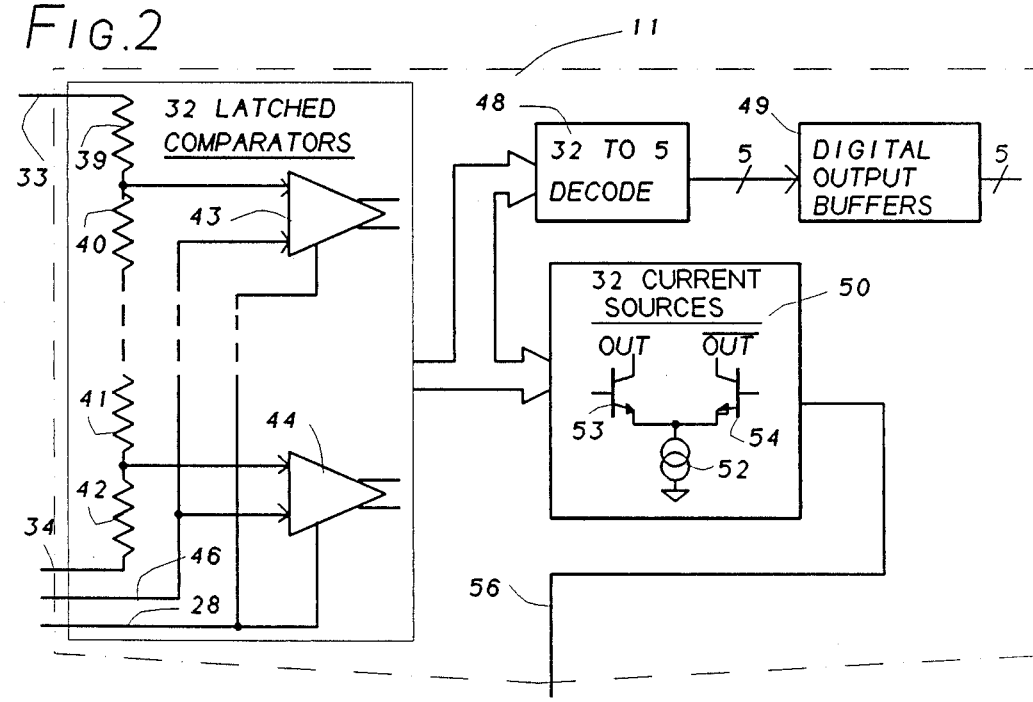
FIG. 2 is a schematic circuit diagram of an A/D/A component used in the system of FIG. 1.

The construction of the A/D/A component 11 is illustrated schematically in FIG. 2. It includes a string of resistors which are connected in series between the plus and minus reference voltage lines 33 and 34 to develop at junctions of the resistors a series of thirty two reference voltages levels in steps of uniform magnitude. Resistors 39, 40, 41 and 42 of the string are shown in FIG. 2.

The thirty two reference voltages developed at the resistor junctions are applied to inputs of thirty two latched comparators; as shown, the junction between resistors 39 and 40 is connected to one input of a latched comparator 43 and the junction between resistors 41 and 42 is connected to one input of a latched comparator 44. The other inputs of the illustrated comparators 43 and 44 as well as corresponding inputs of all other comparators are connected through a line 46 to the output of the sample and hold circuit 22. A clock signal is periodically applied to all comparators through the line 28. When applied, each comparator is latched in an on or off state according to whether or not the reference level applied to one input thereof is exceeded by the level of the analog input then applied on line 46.

Thus the magnitude of the input analog voltage is indicated digitally by the number of comparators which are latched to an "on" state, thereby providing a "thermometer" code output. To develop a binary coded output, a 32 to 5 decode circuit 48 is provided connected through 64 lines to the comparators, each of the illustrated comparators having two output lines of opposite state. The five line output of the decode circuit 48 is connected to digital output buffers 49 to provide a five line output for connection to the register 12.

The A/D/A component 11 further includes a thermometer code D/A circuit 50 which is independent of the decode circuit 48 and which operates directly in response to the thermometer code and at high speed to develop an analog signal proportional to the number of comparators which are switched to an "on" state. The connection of a current source 52 to a pair of transistors 53 and 54 is shown schematically in FIG. 2. Thirty two of such current sources are provided each being connected to the emitters of a pair of transistors. The bases of each pair of transistors is connected to a pair of output lines of one of the comparators, so that one transistor of each pair is on or conductive while the other is off or non-conductive. In the illustrated system, the collector of one transistor of each pair is connected to an analog output line 56 of the A/D/A component 11 which is connected to the summing node 18. The collector of the other transistor of each pair is not used as an output.

In the operation of the system, the total current of the active current sources of the thermometer code D/A circuit 50 flows through the resistor 19 to develop a proportional voltage thereacross. The voltage developed at the summing node 18 is thereby equal to the difference between the voltage at the output of the amplifier 20, which is proportional to the magnitude of the input analog signal, and the voltage across the resistor 19, which is proportional to the number of active current sources and the digital output of the A/D/A component 11. Thus an analog difference or error signal is developed which is applied to the subrange A/D converter 16 to develop the less significant bits of the final digital output of the system.

In the illustrated system, the amplifier 17 operates as a buffer to isolate the summing node 18 from a high capacitance of the input of the subrange A/D converter 16 and the amplifier 20 has a very low output impedance and a fast response characteristic so that with respect to changes in the analog voltage at the input of amplifier 20, the speed of response at the summing node 18 is determined by the value of resistor 19 and the parasitic capacitance at the summing node 18. Amplifier 20 may preferably be a commercially available type of amplifier having a very short settling time, for example an amplifier available from Comlinear, Inc. which settles to 0.1% within 12 ns. This type of amplifier is generally unsuitable for subranging architectures of the prior art in that when designed to achieve a short settling time, the output of the amplifier may not be easily clamped. With the architecture of the invention, however, clamping of the output of the amplifier 20 is not required. The voltage at the summing node may swing through a substantial range, the application of excessive voltages to the amplifier 17 and converter 16 being prevented by the operation of the clamping diodes 35 and 36.

In accordance with a specific feature of the invention, the amplifier 20 has a gain which is substantially greater than unity gain to increase the response speed and to obtain increased accuracy. The amplifier 17 may be operated at unity gain to obtain high accuracy and to operate as a buffer, as aforementioned, and isolate the node 18 from the high input impedance of the converter 16. By way of example, and not by way of limitation, the amplifier 20 may have a gain of 4, the resistance of resistor 19 may be 250 ohms and each of the thirty two current sources of the D/A converter 50 may conduct a current of 0.5 ma to provide a total current of 16 ma when all sources are active, and to produce a voltage drop across the resistor 19 of 4 volts and to produce a null at the node 18 when the input voltage is 1 volt.

When the input voltage is increased from zero, the voltage at the node 18 increases until it reaches a voltage of 0.125 volts at which point the input voltage is 0.03125 volts and the voltage the output of amplifier 20 is 0.125 volts. When input voltage exceeds a reference voltage level of 0.03125 volts, a first one of the comparators and a first one of the current sources become active to reduce the voltage at the node 18 to zero. As the input voltage is increased above 0.03125, the voltage at the node increases until it again reaches a voltage of 0.125 volts, at which point the input voltage is 0.0625 volts, the voltage at the output of amplifier 20 is 0.25 volts. Then with an increase of the input voltage above a second reference voltage level of 0.0625 volts, a second one of the current sources becomes active, again reducing the voltage at the node 18 to zero.

In the illustrated system, the subrange A/D converter has a bit capacity of eight and assuming a maximum input voltage of 1 volt, the quanta size is 1/256 volts and a 0.125 volt input produces a five bit binary output (00011111), so that the amplifier 17 may have a unity gain, as aforementioned and there is a three bit overlap, under the assumptions made. The bit overlap is highly advantageous. For example, there may be offset or gain drifts in the comparators and current sources or a delay in the operation of comparators and current sources in dynamic conditions, such as produce an inaccurate output from the main range converter and a corresponding inaccuracy in the current applied to the node 18, and the voltage at the node 18 may swing outside its normal range while the subrange A/D converter 16 accurately registers the difference between the input voltage and a voltage corresponding to the output which corresponds to the main range digital data. The subrange A/D converter 16 will then accurately register the voltage at the node 18 and, in the logic circuit 14, it overrides any inaccuracy in the main range to provide the correct digital output.

These features allow operation over a wider temperature range since offset and gain drifts are corrected. Also, the main range A/D may be strobed before the sample and hold circuit 22 has completely settled, and the converter may be operated at a higher sampling rate.

The invention thus provides an A/D architecture which is relatively simple and straight forward in construction and operation while achieving accurate and reliable results at high speeds. The architecture is such that it can be readily fabricated and is otherwise such that converters of the invention are economically manufacturable.

It should be understood that specific values and operating parameters are set forth to facilitate an understanding of the operation of the system of the invention, and are not to be construed as limitations.

It will also be understood that modifications and variations may be effected without departing from the spirit and scope of the novel concepts of this invention.

I claim:

1. An analog to digital converter system for developing output which corresponds to the magnitude of an input analog signal, said system comprising: input means for receiving said input analog signal, a main range A/D converter including reference voltage means for developing a series of reference levels in steps of uniform magnitude, a plurality of comparator means coupled to said means and said reference voltage means and arranged to compare the magnitude of said input analog signal with said reference voltage levels to develop a number of comparator output signals equal to the number of reference voltage levels which are exceeded by the magnitude of said input analog signal, and decoder means coupled to said comparator means for responding to said comparator output signals and developing a group of binary coded MSB signals for defining the more significant bits of the digital output, circuit means coupled to said input means and to said plurality of comparator means of said main range A/D converter and arranged for developing first and second signals and a difference signal having a magnitude equal to the difference between the magnitudes of said first and second signals, said circuit means including amplifier means operative to develop said first signal from said input analog signal said first signal being directly developed from said input analog signal and having an amplified magnitude proportional to the magnitude of said input analog signal, and said second signal being directly developed from said comparator output signals and having a magnitude proportional to the number of said comparator output signals, said circuit means including a summing node at which said difference signal is developed, summing resistance means having one end connected to said summing node, with the other end of said summing resistance means connected to said amplifier means, and current source means connected to said summing node and to said comparator means and arranged to control current flow through said summing resistance means in proportional to the number of said comparator output signals, a buffer means having an input connected to said summing node for applying said difference signal developed at the summing node to a subrange A/D converter connected to said buffer means, said subrange A/D converter responding to said difference signal to develop a group of LSB signals for defining the less significant bits of the digital output, and logic means for combining said MSB signals from said main range A/D converter and said LSB signals from said subrange A/D converter to develop said digital output.

2. An analog to digital converter system as defined in claim 1, wherein the gain of said amplifier means is substantially greater than unity.

3. An analog to digital converter system as defined in claim 1 wherein said current source means includes a plurality of current sources directly driven by said comparator output signals and connected to said summing node.

4. An analog to digital converter system as defined in claim 1, further including clamp means connected to said summing node to limit the voltage range thereat.

5. An analog to digital converter system as defined in claim 1, wherein said input means includes a sample and hold circuit for supplying said input analog signal to said comparator means of said main range A/D converter and to said circuit means.

6. An analog to digital converter system as defined in claim 5, further including clock means for applying clocking signals to said sample and hold circuit, to said comparator means of said main range A/D converter and to said subrange A/D converter.

7. An analog to digital converter system as defined in claim 6, further including register means for registering said group of MSB signals and connected to said clock means to receive clocking signals therefrom.

8. An analog to digital converter system as defined in claim 6, further including output register means coupled to said logic means for registering said digital output signal and connected to said clock means to receive clocking signals therefrom.

9. An analog to digital converter system as defined in claim 1, wherein the number of bits of said digital output is less than the total of the bits of said groups of MSB and LSB signals and wherein said MSB and LSB signals are combined with an overlap in said logic means.

10. An analog to digital converter system as defined in claim 3, wherein the gain of said amplifier means is on the order of 4.

11. An analog to digital converter system as defined in claim 10 wherein said amplifier means has a settling time of about 12 nanoseconds.

12. An analog to digital converter system as in claim 6 wherein the number of bits of said digital output is less than the total of the bits of said groups of MSB and LSB signals and wherein said MSB and LSB signals are combined with an overlap in said logic means, and wherein a clocking signal is applied to said comparator means of said main range A/D converter prior to complete settling of said amplifier means.

* * * * *